United States Patent [19]

Myers et al.

[11] Patent Number: 5,038,115
[45] Date of Patent: Aug. 6, 1991

[54] METHOD AND APPARATUS FOR FREQUENCY INDEPENDENT PHASE TRACKING OF INPUT SIGNALS IN RECEIVING SYSTEMS AND THE LIKE

[76] Inventors: Glen A. Myers, 279 Laureles Grade Rd., Salinas, Calif. 93908; Stephen C. Petersen, 4222 Davis St., Santa Clara, Calif. 95054

[21] Appl. No.: 530,123

[22] Filed: May 29, 1990

[51] Int. Cl.$^5$ .................................... H03L 7/07
[52] U.S. Cl. .................................. 331/2; 331/25; 328/165; 455/260
[58] Field of Search ............ 331/2, 11, 25; 329/325, 329/326, 358; 455/260; 375/120; 328/165

[56] References Cited

U.S. PATENT DOCUMENTS

| | | | |
|---|---|---|---|
| 4,027,264 | 5/1977 | Gutleber | 328/167 |
| 4,500,851 | 2/1985 | Sawa et al. | 331/2 |
| 4,516,084 | 5/1985 | Crowley | 331/2 |
| 4,567,448 | 1/1986 | Ikeda | 331/25 |
| 4,859,958 | 8/1989 | Myers | 329/112 |

*Primary Examiner*—Siegfried H. Grimm
*Attorney, Agent, or Firm*—Schroeder, Davis & Orliss Inc.

[57] ABSTRACT

The output signal of a phase tracking system maintains phase coherence with the dominant input signal while tracking the frequency of that same dominant input signal without additional phase shifting circuitry. Circuitry having a second phase locked loop is added to a conventional phase locked loop to form a phase tracking system which provides a precisely constant phase shift over a full range of frequencies of the signal captured by the conventional phase locked loop.

21 Claims, 4 Drawing Sheets

METHOD AND APPARATUS FOR FREQUENCY INDEPENDENT PHASE TRACKING OF INPUT SIGNALS IN RECEIVING SYSTEMS AND THE LIKE

BACKGROUND OF THE INVENTION

The present invention relates generally to signal receiving systems. In particular, the present invention provides phase coherence with frequency tracking of an input signal and for receiving weak signals in the presence of one or more stronger signals in communication systems. Other uses of the present invention includes digital systems applications, frequency synthesizer applications, and coherent demodulation and correlation applications.

Often, systems designed for receiving weak signals employ a Phase-Locked Loop (PLL) and, in some instances, two or more PLL's are used. In U.S. Pat. No. 4,500,851, two PLL's are connected essentially in cascade for regenerating a weak input signal. In this application, the loop parameters are chosen expressly to remove noise from an applied unmodulated sinusoidal signal having a fixed frequency.

U.S. Pat. No. 4,027,264 uses a PLL to provide a narrowband filter. In this application, a PLL is used for stripping voice signal information from an interfering tone to yield a signal-free duplicate of the interference for subtraction from a composite input signal. In this system, the output of VCO (40) is assumed to be shifted 90 degrees in phase from the input. This is approximately true only for very narrowband PLL circuits initially tuned to the frequency of the applied tone. For complete cancellation, an additional 90 degree phase shift is required, otherwise, only partial cancellation results. Therefore, an additional, external 90 degree phase shift circuit, insensitive to frequency, is required.

It is well known that obtaining phase shift circuits that are insensitive to frequency is difficult. Furthermore, in practical applications of bandpass signal cancelers, the frequency of the signal to be removed is often unknown. Other signal cancellation techniques using phase shift circuits encounter similar difficulties.

In U.S. Pat. No. 4,859,958, issued to the inventor hereof, capture effect associated with frequency demodulators is used in cooperation with PLL's to provide improved demodulation of all of several Frequency Modulation (FM) carriers including weaker signals in the presence of dominant carriers. In an application related to U.S. Pat. No. 4,859,958, co-pending with the present application and also by the inventor hereof, entitled "Multiple Reuse of an FM Band", Ser. No. 07/352,400, filed May 15, 1989, (now U.S. Pat. No. 4,992,747) a number of messages, which share transmitter power and each using the same frequency band simultaneously, can be received utilizing a plurality of cascaded PLL's.

In most applications, the function of a PLL is to track the frequency of the input signal. Referring to FIG. 1, when the loop is functioning, the frequency of the PLL oscillator output is slaved to the frequency of the input signal. The PLL is usable only when the frequency of the oscillator equals that of the input frequency. When the frequency of the oscillator equals the frequency of the input signal, the PLL is said to be in "lock" condition. However, the loop is locked only in frequency, not in phase, with the input signal.

The absence of phase lock in a typical prior art PLL can be shown with continuing reference to FIG. 1. PLL 10 requires that input signal $v_1(t)$ have a periodic form, either sinusoid or square wave typically. Thus, $v_1(t)$ is usually considered a bandpass signal which can be varied or modulated in amplitude or in frequency. In most instances, any amplitude variations are first removed by hard limiter 15 which causes the form of $v_1(t)$, the input signal to PLL 10, to be a square wave having only FM.

With continuing reference to FIG. 1, phase detector 101 and lowpass filter 102 combine to convert the position in time of $v_4(t)$ with respect to $v_1(t)$ to a voltage, namely $v_3(t)$. The position is established relative to a transition through zero volts. When $v_4(t)$ and $v_1(t)$ are sinusoids, this relative position is referred to as relative phase. The voltage $v_3(t)$ can have positive or negative values depending on whether the zero volts position of $v_4(t)$ occurs before or after that of $v_1(t)$.

A non-zero value of $v_3(t)$ causes the frequency of Voltage Controlled Oscillator (VCO) 103 to change from its reference value of $f_r$ Hz. Since $v_3(t)$ is fed back to VCO 103, the adjustment of $f_r$ is just sufficient to achieve frequency lock condition. Therefore, the frequency of $v_4(t)$ equals that of $v_1(t)$.

Similarly, the operation of a PLL as a frequency demodulator may be explained by reference also to U.S. Pat. No. 4,859,958. In the transmitter, the change in message voltage m(t) with time causes a like change in the frequency of the transmitted carrier. The carrier is received as $v_1(t)$ at the demodulator. If the frequency of $v_4(t)$ is to equal that of $v_1(t)$, then the output of lowpass filter 102, namely $v_3(t)$, must follow m(t) or its inverse. Thus, the message variation is recovered as $v_3(t)$.

As noted elsewhere in this specification, a typical prior art PLL is not locked in phase, but it rather is locked in frequency. Referring again to FIG. 1, let the frequency of $v_1(t)$ be $f_1$ Hz, not equal to $f_r$ Hz. When the PLL is locked, then $f_r \rightarrow f_r + \epsilon_r = f_1$ Hz. This condition requires $v_3 \rightarrow v_3 + \epsilon_3$ volts. The generation of $\epsilon_3$ volts requires a change in the time position of $v_4(t)$ relative to that of $v_1(t)$. The changed, or new, position is now referred to as the relative phase, $\phi$, of $v_4(t)$ with respect to $v_1(t)$ for the locked condition. Now, let $f_1$ change so that $f_1 \rightarrow f_1 + \epsilon_1$. Applying the same reasoning which established lock condition of the PLL, then $\phi \rightarrow \phi + \Delta\phi$ when $f_1 \rightarrow f_1 + \epsilon_1$. Thus, a change in the frequency of input voltage $v_1(t)$ is accompanied by an associated change in the phase of VCO 103 output voltage $v_4(t)$ relative to $v_1(t)$. Thus, a change in phase is necessary for a PLL to remain locked in frequency.

SUMMARY OF THE INVENTION

In a number of signal receiving applications, it is desirable to maintain phase coherence with frequency tracking. Such applications include correlation, coherent demodulation of carriers, recovery of clock signals for digital circuits, frequency synthesizers and signal cancellation. The output signal of a phase tracking system (PTS) according to the present invention maintains phase coherence with input signals while tracking the frequency of those same input signals. One output of such a circuit is a voltage having a frequency equal to that of the applied voltage and having time position, i.e. transitions through zero, relative to the applied voltage which does not change as the frequency of the applied voltage changes. Thus, phase coherence refers to the phase coherence of an output voltage of a circuit and the voltage applied to the input of same circuit.

A PTS according to the present invention comprises a PLL and a phase tracking circuit (PTC). According to a preferred embodiment, the PTS provides an output signal having a phase different from the input signal by a constant 180 degrees relative to the input signal. In one application of the present invention, the ability to maintain a precisely constant 180 degree phase relationship between input and output signals under dynamic FM conditions provides for cancellation by simply summing the output signal with an appropriately amplified input signal.

One feature of the PTC is that no additional or external phase shifting circuitry is required. Since the PTS provides a 180 degree phase shift of the signal captured by the conventional PLL over a full range of frequencies, the difficulty of realizing frequency independent external phase shifting circuitry is avoided. Therefore, for cancellation as described earlier in this specification, no additional phase shifting circuitry or network is required when using the PTS of the present invention.

The PTS of the present invention is formed by adding circuitry having a second PLL to a conventional PLL. However, operation of the conventional, or first, PLL is not affected by the additional circuitry. Therefore, the principles of the present invention can be used wherever a conventional PLL is used, namely, by adding PTC circuitry according to the present invention. The combination of the conventional PLL and the PTC provides an additional output signal having phase coherence with the input signal which has captured the first PLL. If a first PLL is not otherwise available in a given application of the present invention, it must be provided as part of a phase tracking system according to the principles of the present invention.

The phase coherence provided by a phase tracking system according to the present invention may be used in several applications. Such applications include but are not limited to:
 a. recovery of a coherent reference for use in carrier demodulation or in correlation (hereafter "coherent reference demodulation");
 b. recovery of a coherent clock for use in digital circuitry (hereafter "coherent clock recovery");
 c. recovery of a coherent signal for use in frequency synthesizer applications (hereafter "coherent signal synthesis"); and
 d. recovery of the inverse of the input signal which allows cancellation of the input voltage by forming the simple sum of the output voltage and amplified input voltage (hereafter "coherent cancellation").

DESCRIPTION OF THE DRAWING

For fuller understanding of the present invention, reference is made to the accompanying drawing in the following detailed Description of the Preferred Embodiment of the invention. In the drawing.

Figure 1:
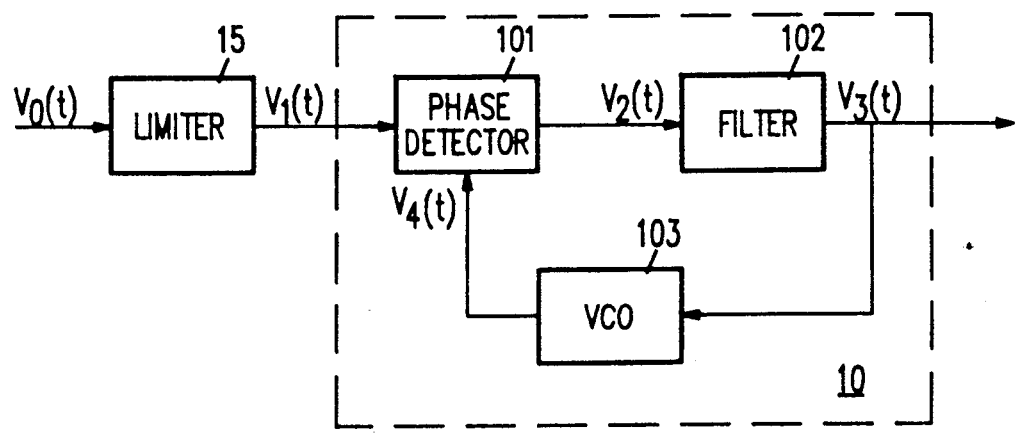
FIG. 1 is a block diagram of a typical prior art PLL.

Reference numbers refer to the same or equivalent parts of the present invention throughout the several figures of the drawing.

DESCRIPTION OF THE PREFERRED EMBODIMENT

Figure 2:
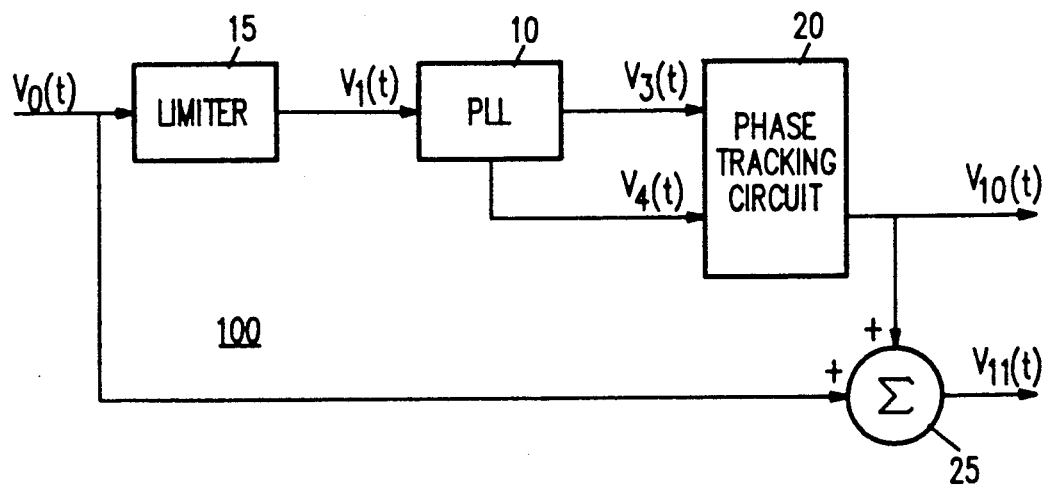
FIG. 2 is a block diagram of a phase tracking system according to the principles of the present invention.

Phase tracking system 100 constructed according to the principles of the present invention comprises hard limiter 15, PLL 10 and PTC 20 as shown in FIG. 2. The input signal $V_0(t)$ may be one of at least four classes of signals as listed below:
 1. a single repetitive signal such as a tone (sinusoid) or square wave. The signal amplitude and frequency may vary because of noise, doppler, etc.;
 2. a single FM carrier;
 3. a wideband input consisting of many sinusoids (tones) separated in frequency; and
 4. a wideband input consisting of two or more FM carriers in the same band (or one or more tones with one or more FM carriers). With multiple FM carriers, the application may be power multiplexing as described in copending application for patent entitled "Multiple Reuse of an FM Band", Ser. No. 07/352,400, filed May 15, 1989 (now U.S. Pat. No. 4,992,747) which is incorporated by reference as if fully set forth herein.

The operation and use of the PTS is now described for each class of input signal. For class 1, the PLL locks to and tracks the frequency of the applied repetitive signal. The PTS provides an output signal which tracks the frequency and the phase of the input signal. The noise level of the output signal is reduced relative to that of the input signal by virtue of lowpass filtering and the two VCO's in the PTS. For this class of input signal, the PTS may be an especially useful improvement in coherent clock recovery, coherent reference demodulation, coherent signal synthesis and coherent cancellation. For example, the PTS may be an attractive choice in recovering pilot tones for use in carrier demodulation. An obvious application is FM stereo broadcasting.

For class 2 input signals, the PLL is typically used as a frequency demodulator. Since the PTS provides some additional filtering, it could be used to improve the quality of the FM carrier prior to subsequent demodulation. Because of the noise behavior of frequency demodulators, a small improvement in signal-to-noise ratio (SNR) prior to demodulation can result in significant improvement in SNR of the recovered message, i.e. the demodulator output. The PTS application here may also include coherent cancellation of the input FM carrier.

Figure 3:
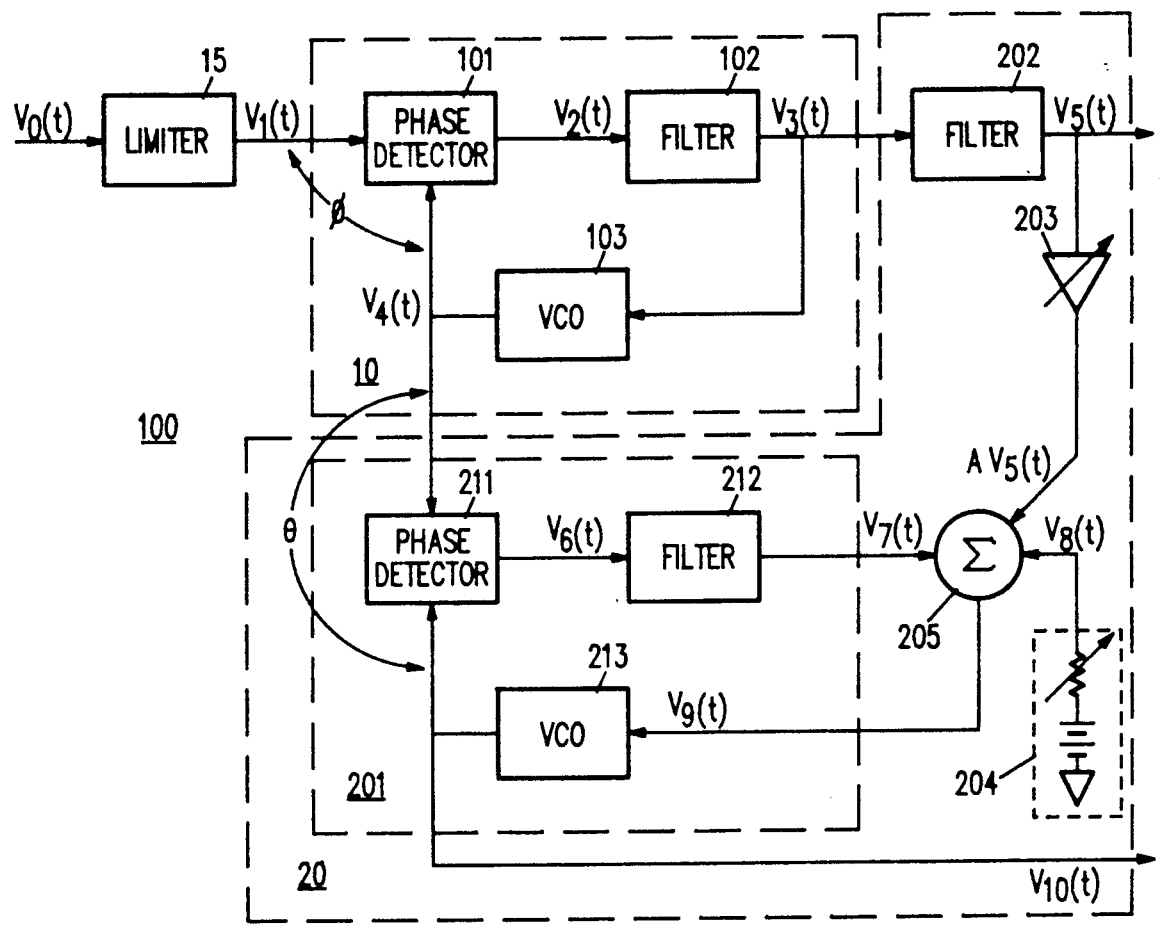
FIG. 3 is a detailed block diagram of the phase tracking system of FIG. 2.

For class 3 input signals, the PLL portion of the PTS will lock onto one (typically the dominant) sinusoid and "track" that one while ignoring the rest. The PTC output is, then, the inverse of the sinusoid that has 'captured' the PLL. A summing network provides cancellation of this sinusoid as shown in FIG. 3. There, $v_{11}(t)$ is $v_0(t)$ less one sinusoidal signal. Thus, each cascaded circuit of FIG. 3 will remove one tone.

For class 3 input signals, the PTS may also be used for coherent clock recovery, coherent reference demodulation, coherent signal synthesis and coherent cancellation. For example, one PTS may be used to cancel a dominant interfering signal while a second PTS is series may be used to recover a weaker pilot signal with phase coherence which can be used as a clock or as . a coherent reference.

If one of the components of a class 3 input signal is modulated in amplitude, it is still possible to provide cancellation by removing the AM from the input signal with an envelope detector and remodulating the PTS output signal prior to summing. The summer, then, has 5 input sinusoids alike in amplitude but opposite in phase and cancellation occurs.

A class 4 input signal comprises a wideband input signal having many bandpass signals which cannot be isolated in frequency. Of particular interest for the present invention is the case where more than one of the signals is frequency modulated, i.e. a power multiplexing application, or some can be tones.

Because of the capture effect of the PLL and by nature of its design, the output of the PTC is a replica of the dominant input signal shifted 180 degrees in phase (i.e., the inverse of the dominant signal) even in the dynamic case of a frequency modulated dominant input. So, complete cancellation of the dominant signal is obtained. The message of the dominant modulated carrier is recovered by the PLL portion of the PTC. Once the dominant signal is removed, repeat circuitry can be used to track or recover messages from the remaining components (FM carriers or tones) of the input signal. Thus, the PTS provides simultaneous demodulation of two FM carriers separated only in power level. Capture effect is described in greater detail in U.S. Pat. No. 4,859,958, which is incorporated by reference as if fully set forth herein.

The phase coherence provided by the PTS of the present invention can be used for class 4 signals to also provide coherent clock recovery, coherent reference demodulation and coherent cancellation.

Referring now to FIG. 3, a PTS constructed according to the principles of the present invention comprises hard limiter 15, PLL 10 and PTC 20. PTC 20 comprises PLL 201, post-detection lowpass filter 202, variable gain amplifier 203, bias voltage source 204 and summing junction 205. PLL's 10 and 201 are similar, each comprising a phase detector, lowpass filter and VCO. In particular, PLL 10 comprises phase detector 101, lowpass filter 102 and VCO 103. Similarly, PLL 201 comprises phase detector 211, lowpass filter 212 and VCO 213.

In operation, if input signal $v_0(t)$ is a single sinusoid having frequency $f_0$, then the frequency of $v_1(t)$ is $f_1$, the frequency $v_2(t)$ is $f_2$, etc. Thus, when PLL 10 is in lock condition, $f_4 = f_1$ Hz. Similarly, when PLL 201 is in lock condition, $f_{10} = f_4 = f_1$ Hz. Therefore, the output signal $v_{10}(t)$ of PTS 100 tracks the frequency of the input signal $v_0(t)$.

Under static conditions, i.e. $f_1$ unchanging, $\phi$ has a constant value of approximately 90 degrees, typically. Therefore the phase of $v_{10}(t)$ relative to $v_1(t)$ or $v_0(t)$ is $\phi + \theta$ degrees, approximately 180 degrees, typically. A constant DC voltage, $v_8$, can be injected into PLL 201 via summing junction 205 to make $\phi + \theta$ exactly equal to 180 degrees. Thus, $v_{10}(t) = -K_1 v_1(t)$, if $v_{10}(t)$ is a square wave, or $v_{10}(t) = -K_2 v_0(t)$, if $v_{10}(t)$ is a sinusoid, where $K_1$ and $K_2$ are positive constants.

Figure 4:
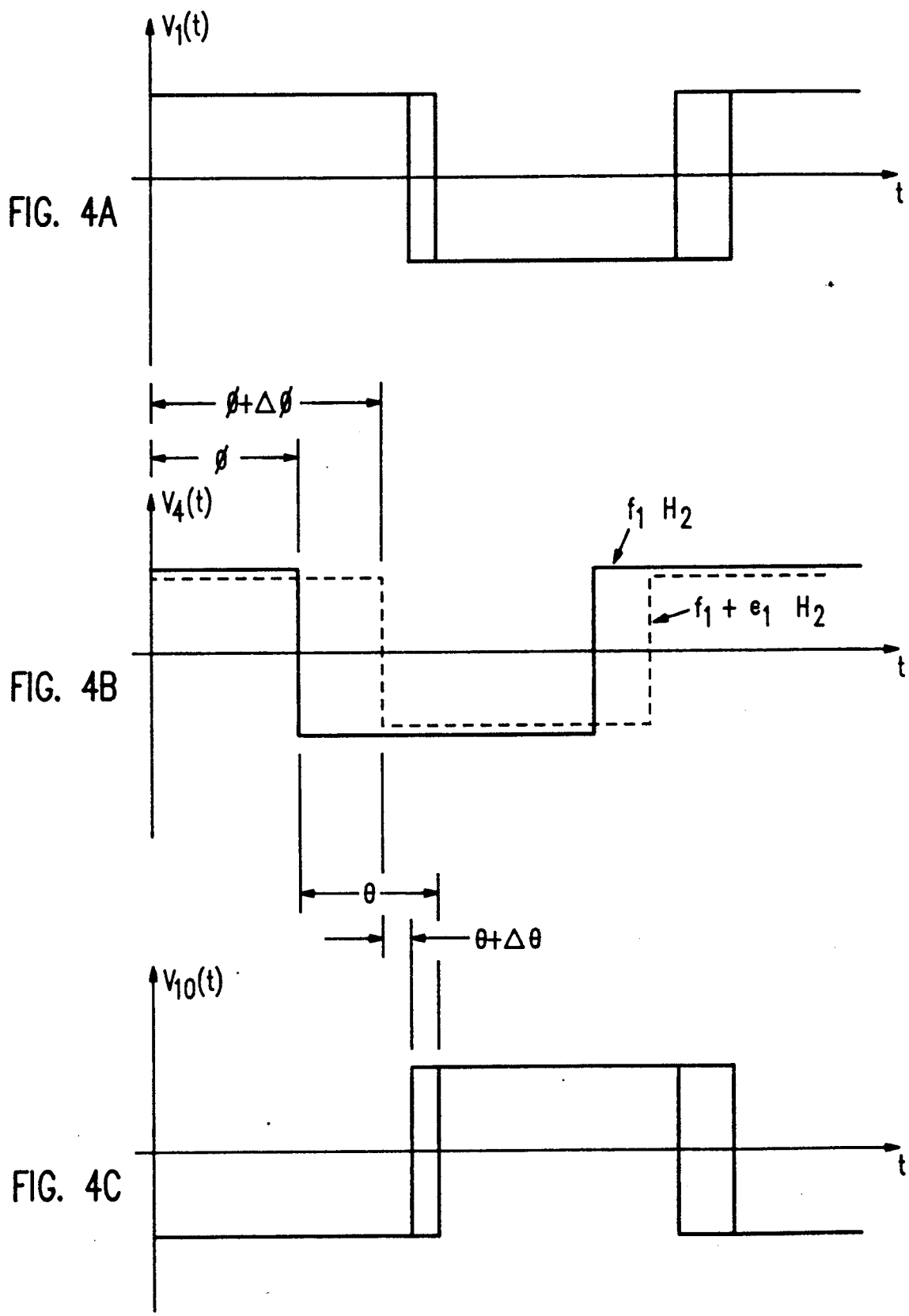
FIGS. 4A, 4B and 4C show a series of waveforms illustrating the operation of the phase tracking system of FIG. 3.

Referring now to FIG. 4, the relative time "positions" of $v_1(t)$, $v_4(t)$ and $v_{10}(t)$ are shown. The signals $v_1(t)$ and $v_{10}(t)$ are shown as they would appear on an oscilloscope when the frequency of the applied voltage changes (FM). To avoid confusion, $v_4(t)$ is shown for only two frequencies. It should be noted that in FIG. 4 when the frequency of $v_1(t)$ is $f_1$ Hz, a constant, then $v_{10}(t) = -K_1 v_1(t)$.

In the dynamic case, $f_1$ changes with time. If $f_1$ assumes a new value, namely, $f_1 + \epsilon_1$ Hz, $\phi$ must assume a new value $\phi + \Delta\phi$ degrees. In order for PLL 10 to maintain lock condition, $f_4$ must become $f_4 + \epsilon_1$ Hz in response to $v_3 + \epsilon_3$. Mathematically, $v_3(t)$ is the average or DC value of the product of $v_1(t)$ and $v_4(t)$. The new position of $v_4(t)$ relative to $v_1(t)$ as frequency increases is illustrated by dashed lines in FIG. 4.

With continuing reference to FIG. 4, it is clear that $v_4(t)$ moves in phase with $v_1(t)$ and out of phase with $v_{10}(t)$. In PLL 10, $v_1(t)$ is the reference for $v_4(t)$, and in PLL 201, $v_4(t)$ is the reference for $v_{10}(t)$. For PLL 201 to maintain lock condition, $f_{10}$ must become $f_{10} + \epsilon_{10} = f_1 + \epsilon_1$ Hz, which requires a change in $v_9(t)$.

The new time position of $v_4(t)$ in no way affects operation of PLL 10 but affects PLL 201 in two ways, namely, 1) by the change in $v_3(t)$ which is coupled into PLL 201 as $A v_5(t)$, where A is the gain of variable amplifier 203, and 2) by a change in $\phi$ which causes $\theta$ to change from $\theta$ to $\theta + \Delta\theta$ degrees. Both of these changes affect $v_9(t)$.

If $v_{10}(t) = -v_1(t)$ is desired, then $(\phi + \Delta\phi) + (\theta + \Delta\theta) = 180$ degrees. Since, in one embodiment of the present invention involving the case of constant value of $f_1$, $v_8(t)$ was adjusted so that $\phi + \theta = 180$ degrees, the condition of interest is $\Delta\theta = -\Delta\phi$. This latter condition is maintained by controlling the amount of $v_3(t)$ applied to VCO 213 via filter 202, variable gain amplifier 203 and summing junction 205 as $v_9(t)$ to the input of VCO 213. Therefore, by controlling gain A of amplifier 203 the condition $\Delta\theta = -\Delta\phi$ can be maintained as frequency $f_1$ varies with time. The linear phase-to-voltage conversion characteristics of the phase detectors and the linear voltage-to-frequency conversion characteristics of the VCO's result in $\Delta\theta = -\Delta\phi$ over the entire lock frequency range of PLL 10. Since the lock frequency range of PLL 201 can easily be made to exceed that of PLL 10, $v_{10}(t) = -K_1 v_1(t)$, even as $f_1$ changes with time.

Setting $v_8(t)$ such that $\phi + \theta = 180$ degrees compensates for the difference in the rest frequencies of the two VCO's. If $f_1$ is modulated and the gain of amplifier 203 is adjusted so that $v_{10}(t) = -K_1 v_1(t)$, then $v_{11}(t)$ of FIG. 2 may be set to achieve a null or any other diagnostic condition the user may wish to define.

Figure 5:
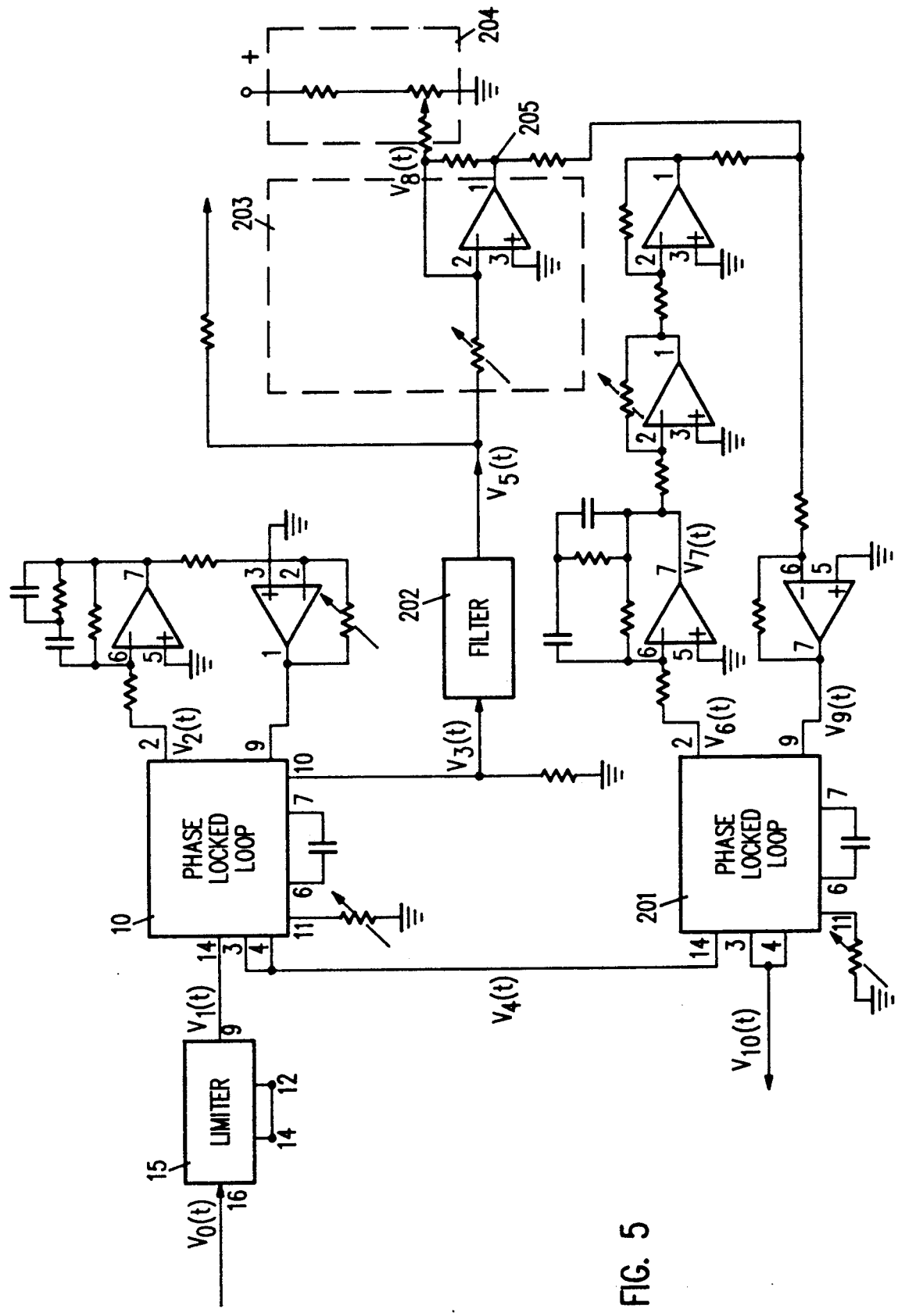
FIG. 5 is a circuit diagram of one embodiment of the phase tracking system of FIG. 3.

One embodiment of the phase tracking system of FIG. 3 is shown in FIG. 5. Hard limiter 15 comprises type 604 manufactured by Signetics, Inc., PLL's 10 and 201 comprise type 74HCT4046 manufactured by Motorola, Inc. and post detection filter 202 is a well known Butterworth filter comprising discrete components not shown and forms no part of the present invention. All operational amplifiers are type TL082 manufactured by Texas Instruments, Inc. All resistor and capacitor values are easily determined by reference to the design manuals provided by the manufacturers of the integrated circuits listed for this circuit.

While the present invention has been particularly shown and described with respect to certain preferred embodiments thereof, it should be readily apparent to those of ordinary skill in the art that various changes and modifications in form and details may be made without departing from the spirit and scope of the invention as set forth in the appended claims.

We claim:

1. Apparatus for providing an output signal having phase coherence with the dominant one of a plurality of input signals while tracking the frequency of said dominant input signal, said apparatus comprising:

input means for receiving said input signals, for producing a first output signal representing the frequency of the dominant input signal of said plurality of input signals, and for producing a replica signal of said dominant input signal; and phase tracking means, coupled to said input means, for receiving said first output signal and said replica signal for producing a second output signal having phase coherence with said dominant input signal.

2. Apparatus as in claim 1 wherein said input means includes signal amplitude limiting means.

3. Apparatus as in claim 1 wherein said input means includes first frequency tracking means.

4. Apparatus as in claim 1 wherein said phase tracking means includes second frequency tracking means.

5. Apparatus for recovering an output signal representing a coherent reference signal which is phase coherent with the dominant one of a plurality of input signals for use in carrier demodulation, said apparatus comprising:

input means having first frequency tracking means for producing a first output signal representing the frequency of the dominant input signal of said plurality of input signals, and for producing a replica signal of said dominant input signal; and phase tracking means having second frequency tracking means, coupled to said input means, for receiving said first output signal and said replica signal, for transmitting said first output signal and for producing a second output signal representing said coherent reference signal having phase coherence with said dominant input signal of said plurality of input signals.

6. Apparatus for recovering an output signal representing a coherent clock signal which is phase coherent with the dominant one of a plurality of input signals for use in digital systems, said apparatus comprising:

input means having first frequency tracking means for producing a first output signal representing the frequency of the dominant input signal of said plurality of input signals, and for producing a replica signal of said dominant input signal; and phase tracking means having second frequency tracking means, coupled to said input means, for receiving said first output signal and said replica signal, for transmitting said first output signal and for producing a second output signal representing said coherent clock signal having phase coherence with said dominant input signal of said plurality of input signals.

7. Apparatus for recovering an output signal representing a coherent signal which is phase coherent with the dominant one of a plurality of input signals for use in frequency synthesizer systems, said apparatus comprising:

input means having first frequency tracking means for producing a first output signal representing the frequency of the dominant input signal of said plurality of input signals, and for producing a replica signal of said dominant input signal; and phase tracking means having second frequency tracking means, coupled to said input means, for receiving said first output signal and said replica signal, for transmitting said first output signal and for producing a second output signal representing said coherent signal having phase coherence with said dominant input signal of said plurality of input signals.

8. Apparatus for recovering an output signal comprising the inverse of an input signal which is phase coherent with the dominant one of a plurality of input signals for use in canceling said input signal by forming the simple sum of said inverse signal with said dominant input signal, said apparatus comprising:

input means having first frequency tracking means for producing a first output signal representing the dominant signal of said plurality of input signals, and for producing a replica signal of said dominant input signal; and phase tracking means having amplifier means, coupled to said input means, for receiving said first output signal and said replica signal to produce a second output signal having phase coherence with said dominant input signal of said plurality of input signals, and for combining said second output signal with said dominant input signal to cancel said dominant input signal.

9. Apparatus as in claims 5 or 6 or 7 or 8 wherein said input means further includes signal amplitude limiting means.

10. Apparatus as in claims 5 or 6 or 7 wherein said phase tracking means further includes:

amplifier means for receiving and selectively amplifying said first output signal;

bias means for producing a bias voltage; and summing means, coupled to said second frequency tracking means, amplifier means and bias means, for coupling said amplified first output signal and said bias voltage to said second frequency tracking means.

11. Apparatus as in claims 5 or 6 or 7 wherein said first and second frequency tracking means each include a phase locked loop.

12. Apparatus as in claims 8 or 10 wherein said amplifier means includes filter means for filtering said first output signal.

13. Apparatus for providing a phase coherent output signal having phase coherence with the input signal to a phase locked loop captured by said input signal, said apparatus comprising:

replica means for producing a replica signal of said input signal; and phase tracking means having frequency tracking means, coupled to said phase locked loop and to said replica means, for receiving the output signal of said phase locked loop and said replica signal to produce said output signal having phase coherence with said input signal.

14. Apparatus as in claim 13 wherein said replica means comprises the voltage controlled oscillator of said phase locked loop captured by said input signal.

15. Apparatus as in claim 14 wherein said replica signal is the output signal of said voltage controlled oscillator.

16. Apparatus as in claim 1 wherein said phase tracking means also transmits said first output signal.

17. Apparatus as in claims 4 or 5 or 6 or 7 wherein said phase tracking means includes amplifier means for selectively amplifying said first output signal of said input means and for combining a first output signal of said second frequency tracking means with said amplified first output signal.

18. Apparatus as in claim 13 wherein said phase tracking means also transmits said phase coherent output signal.

19. Apparatus for providing an output signal having phase coherence with an input signal while tracking the frequency of said input signal, said apparatus comprising:

input means for receiving said input signal, for producing a first output signal representing the frequency of the input signal and for producing a replica signal of said input signal;

phase tracking means, coupled to said input means, for receiving said first output signal and said replica signal for producing a second output signal having phase coherence with said input signal.

20. Apparatus as in claim 8 wherein said amplifier means includes second frequency tracking means.

21. Apparatus as in claim 1 further including summing means for combining said second output signal with said plurality of input signals to cancel said dominant input signal.

* * * * *